United States Patent
Tsai et al.

(10) Patent No.: US 9,559,005 B2
(45) Date of Patent: Jan. 31, 2017

(54) METHODS OF PACKAGING AND DICING SEMICONDUCTOR DEVICES AND STRUCTURES THEREOF

(71) Applicant: Taiwan Semiconductor Manufacturing Company, Ltd., Hsin-Chu (TW)

(72) Inventors: Yu-Peng Tsai, Taipei (TW); Wen-Hsiung Lu, Jhonghe (TW); Hui-Min Huang, Taoyuan (TW); Wei-Hung Lin, Xinfeng Township (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/448,932

(22) Filed: Jul. 31, 2014

(65) Prior Publication Data
US 2015/0214077 A1    Jul. 30, 2015

Related U.S. Application Data

(60) Provisional application No. 61/931,425, filed on Jan. 24, 2014.

(51) Int. Cl.
| | |
|---|---|
| H01L 21/50 | (2006.01) |
| H01L 21/46 | (2006.01) |
| H01L 21/78 | (2006.01) |
| H01L 23/31 | (2006.01) |
| H01L 21/56 | (2006.01) |
| H01L 23/00 | (2006.01) |

(52) U.S. Cl.
CPC ............ *H01L 21/78* (2013.01); *H01L 21/561* (2013.01); *H01L 23/3114* (2013.01); *H01L 23/562* (2013.01); *H01L 2224/11* (2013.01); *H01L 2924/0002* (2013.01)

(58) Field of Classification Search
CPC .... H01L 21/78; H01L 23/3114; H01L 21/561; H01L 23/3185; H01L 21/563
USPC .................................................. 438/114, 458
See application file for complete search history.

(56) References Cited

U.S. PATENT DOCUMENTS

| | | | |
|---|---|---|---|
| 6,338,980 B1 * | 1/2002 | Satoh | H01L 21/561 257/E21.508 |
| 7,160,756 B2 * | 1/2007 | Kripesh | H01L 23/3185 257/E21.502 |

(Continued)

*Primary Examiner* — Luan C Thai
(74) *Attorney, Agent, or Firm* — Slater Matsil, LLP (57) ABSTRACT

Methods of packaging and dicing semiconductor devices, and packaged semiconductor devices are disclosed. In some embodiments, a method of packaging and dicing semiconductor devices includes a first cutting process performed on a wafer to form a groove passing through a passivation layer and an interconnect structure on a scribe line region and a portion of a semiconductor substrate on the scribe line region. Next, a molding compound layer is formed on a frontside of the wafer to fill the groove. After performing a grinding process on a backside of the wafer to thin down the semiconductor substrate, a second cutting process is performed on the wafer to separate the individual dies. The second cutting process cuts through the molding compound layer in the groove and the semiconductor substrate underlying the groove.

20 Claims, 7 Drawing Sheets

(56) References Cited

U.S. PATENT DOCUMENTS

| | | | |
|---|---|---|---|
| 8,048,778 B1* | 11/2011 | Ku | H01L 21/78 |
| | | | 257/E21.599 |
| 8,154,133 B2* | 4/2012 | Koroku | H01L 21/561 |
| | | | 257/774 |
| 2006/0079025 A1 | 4/2006 | Kripesh et al. | |
| 2009/0115058 A1* | 5/2009 | Yu | H01L 24/13 |
| | | | 257/738 |
| 2014/0048926 A1* | 2/2014 | Wang | H01L 23/3185 |
| | | | 257/737 |

* cited by examiner

METHODS OF PACKAGING AND DICING SEMICONDUCTOR DEVICES AND STRUCTURES THEREOF

PRIORITY CLAIM AND CROSS-REFERENCE

This application claims priority to U.S. Provisional Application Ser. No. 61/931,425, filed on Jan. 24, 2014, entitled "Dicing in Two Mask Wafer Level Die Scale Package," which application is hereby incorporated herein by reference.

BACKGROUND

Modern integrated circuits are made of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective die. Electrical connections are made through bond pads to connect the die to a package substrate or another die. Bond pads can be used for wire bonding or flip-die bonding. Flip-die packaging utilizes bumps to establish electrical contact between a die's input/output (I/O) pads and the substrate or lead frame of the package. Structurally, a bump structure usually refers to a bump and an "under bump metallurgy" (UBM) located between the bump and an I/O pad. Wafer level die scale packaging (WLCSP) is currently widely used for its low cost and relatively simple processes, and ball placement or ball drop process is utilized in the WLCSP technology.

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are manufactured on a single semiconductor wafer. The individual dies are typically singulated by sawing the integrated circuits along a scribe line. The individual dies are then packaged separately, in multi-die modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies also require smaller packages that utilize less area than packages of the past, in some applications. Wafer level die scale packages (WLCSP) are one type of smaller packaging devices for semiconductor devices, in which dies are packaged while still in wafer form and then are singulated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Embodiments of the present disclosure provide novel methods of packaging and dicing semiconductor devices and structures thereof wherein a laser is used to dice at least a portion of a die. In some embodiments, an encapsulating material disposed over the die is also diced using the laser. The novel laser dicing process results in the formation of few or no cracks and debris, and avoids peeling and delamination of material layers of the die.

Figure 1:
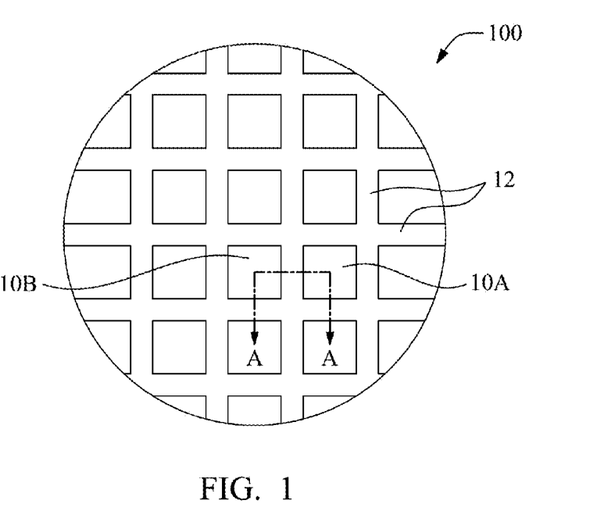
FIG. 1 is a top view of a semiconductor wafer in accordance with some embodiments of the present disclosure.

Referring first to FIG. 1, a top view of a semiconductor wafer 100 is shown that includes a plurality of integrated circuit dies (or chips) 10A and 10B formed thereon in accordance with some embodiments of the present disclosure. On the semiconductor wafer 100, an array of dies 10A and 10B are separated from each other by two sets of intersecting scribe line regions 12. One set of scribe line regions 12 extend along a first direction and another set of scribe line regions 12 extend along a second direction perpendicular to the first direction. In accordance with an embodiment, the dies 10A and 10B have a substantially identical structure.

FIG. 2 through 5 are cross-sectional views taken along the line A-A shown in FIG. 1 to illustrate a method of packaging and dicing a semiconductor device at various stages in accordance with some embodiments.

Figure 2:
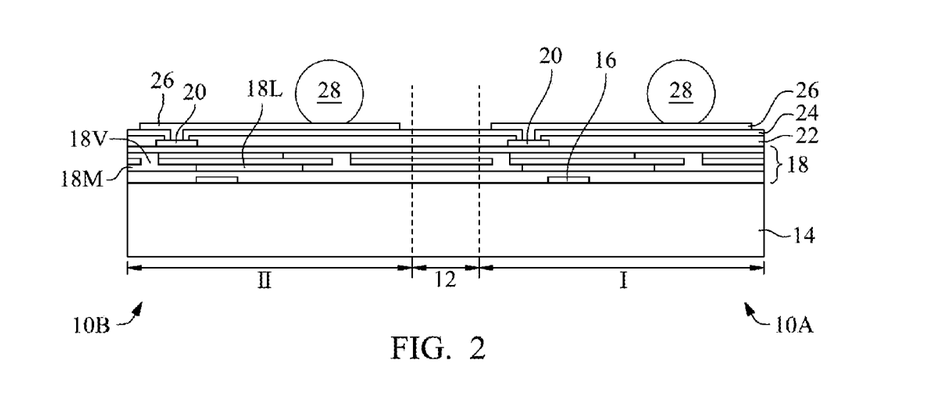
FIGS. 2 to 5 are cross-sectional views taken along the line A-A shown in FIG. 1 to illustrate a method of packaging and dicing a semiconductor device at various stages in accordance with some embodiments.

Referring to FIG. 2, the cross-section view illustrates the first die 10A formed on a first die region I and the second die 10B formed on a second die region II, and the die regions I and II are separated by the scribe line regions 12. In manufacturing each die 10A and 10B on the die regions I and II, semiconductor processes are performed on a semiconductor substrate 14 to form electrical circuitries 16, an interconnect structure 18, contact pads 20, a passivation layer 22, a protection layer 24, post-passivation interconnect (PPI) structures 26 and bumps 28. In an at least one embodiment, the interconnect structure 18 and layers 20 and 22 are also formed to extend onto the scribe line regions 12.

The semiconductor substrate 14 may include, for example, bulk silicon, doped or undoped, or an active layer of a semiconductor-on-insulator (SOI) substrate. Other substrates, such as a multi-layered or gradient substrate may also be used. The electrical circuitries 16 formed in the semiconductor substrate 14 may be any type of circuitry suitable for a particular application. In some embodiments, the electrical circuitry 16 includes electrical devices having one or more dielectric layers overlying the electrical devices. Metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. The above examples are provided for illustrative purposes only to further explain applications of some illustrative embodiments. Other circuitry may be used as appropriate for a given application.

The interconnect structure 18 includes a plurality of dielectric layers 18L and metal lines 18M and/or metal vias 18V formed inside the dielectric layers 18L to provide an electrical connection to the circuitry 16 formed in the semiconductor substrate 14. The dielectric layer 18L may be formed, for example, of a low dielectric constant (low-K) dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, Metal lines and/or vias (not shown) may be formed inside the dielectric layer 16 to provide an electrical connection to the electrical circuitry formed in the semiconductor substrate 14. In some embodiments, the uppermost dielectric layer is formed of a dielectric material, such as silicon nitride, silicon oxide, undoped silicon glass, and the like.

The contact pads 20 are formed on the uppermost dielectric layer of the interconnect structure 18 to electrically connect the metal lines 18M or metal vias 18V inside the dielectric layers 18L. In some embodiments, the contact pads 20 are formed of aluminum, aluminum copper, aluminum alloys, copper, copper alloys, or the like. One or more passivation layers 24 are formed on the uppermost dielectric layer of the interconnect structure 18 and patterned to form openings exposing portions of the contact pads 20 respectively. In some embodiments, the passivation layer 22 is formed of a dielectric material, such as undoped silicate glass (USG), silicon nitride, silicon oxide, silicon oxynitride or a non-porous material by any suitable method, such as CVD, PVD, or the like. In an embodiment, the passivation layer 22 is formed to cover a peripheral portion of each contact pad 20, and to expose a central portion of each contact pad 20 through the opening in the passivation layer 22. The protection layer 24 is formed over the passivation layer 22 and patterned to expose portions of the contact pads 20 respectively. In some embodiments, the protection layer 24 is a polymer layer, which is patterned to form openings, through which the contact pads 20 are exposed. In some embodiments, the polymer layer is formed of a polymer material such as an epoxy, polyimide, benzocyclobutene (BCB), polybenzoxazole (PBO), or the like, although other relatively soft, often organic, dielectric materials can also be used. The formation methods include spin coating or other methods.

The PPI structures 26 are formed on the protection layer 24 and electrically connected to the contact pads 20 respectively through the openings in the protection layer 24. The PPI structures 26 can function as interconnection layers, power lines, re-distribution lines (RDL), inductors, capacitors or any passive components. In some embodiments, the PPI structures 26 are formed by depositing a metallization layer on the protective layer 24 and filling the openings in the protective layer 24 and then patterning the metallization layer by using lithography and etching processes. For example, the metallization layer is formed of copper, aluminum, copper alloys, aluminum alloys, or other mobile conductive materials using plating, electroless plating, sputtering, chemical vapor deposition methods with a photoresist mask, or other suitable methods. In an embodiment, the PPI structures 26 are formed on the die regions 10I and 10II without extending to the scribe line regions 12. In some embodiments, the PPI structures 26 can extend to the scribe line regions 12 according to circuitry designs and process controls.

The bumps 28 are formed on the PPI structures 26. The bump 28 can be a spherical bump or a pillar bump formed of a conductive material including at least one of solder, Cu, Ni or Au. In an embodiment, the bump 28 is a solder bump formed by attaching a solder ball to the PPI structures 26 and then thermally reflowing the solder material. In an embodiment, the solder bump is formed by plating a solder layer using photolithography technologies followed by reflow processes. In an embodiment, the solder bump has a diameter greater than about 200 μm. In some embodiments, the solder bump includes a lead-free pre-solder layer, SnAg, or a solder material including alloys of tin, lead, silver, copper, nickel, bismuth, or combinations thereof.

Figure 3:
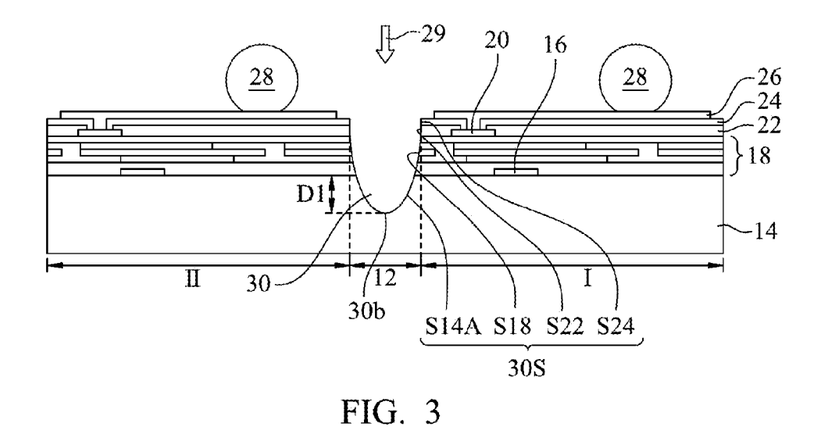

Referring to FIG. 3, a first cutting process 29 is performed on the semiconductor wafer 100 to form grooves 30 on the scribe line regions 12. In an embodiment, the first cutting process 29 is also referred to a pre-cutting process 29 that removes materials within the scribe line regions 12, including portions of the protective layer 24, the passivation layer 22, dielectric layers 18L in the interconnect structure 18, metal lines 18M in the interconnect structure 18 and the semiconductor substrate 14, resulting in sidewalls S24, S22 of the layers 24, 22 and the sidewalls S18 and S14A of the interconnect structure 18 and the semiconductor substrate 14. The sidewalls S24, S22, S18 and S14A are continuously formed as a sidewall portion 30S of the groove 30. The pre-cutting process 29 does not penetrate the semiconductor substrate 14, and the bottom portion 30b of the groove 30 reaches a depth D1 of the semiconductor substrate 14. In an embodiment, the depth D1 is equal to or greater than about 10 μm. For example, D1 is about 10 μm~15 μm.

The grooves 30 on the wafer 100 can be formed in a continuous manner on the scribe line regions 12 according to one embodiment, such that the planar layout of the grooves 30 is substantially similar to that of the intersecting scribe line regions 12. In some embodiments, the grooves 30 on the wafer 100 can be formed in a discontinuous manner in the scribe line regions 12 and separated from each other by a distance. The pre-cutting process 29 can use laser cutting, laser micro-jet cutting, bevel cutting, blade sawing, or the like. The sidewall portion 30S of the groove 30 may be formed with curved or vertical sidewalls, and the sidewall portion 30S may have smooth or rough surfaces depending on the cutting method employed in the pre-cutting process 29. In an embodiment, the grooves 30 are formed by a laser cutting method which uses a laser beam to irradiate the scribe line regions 12, and the sidewall portion 30S of the groove 30 is a curved sidewall with a rough surface.

Figure 4:
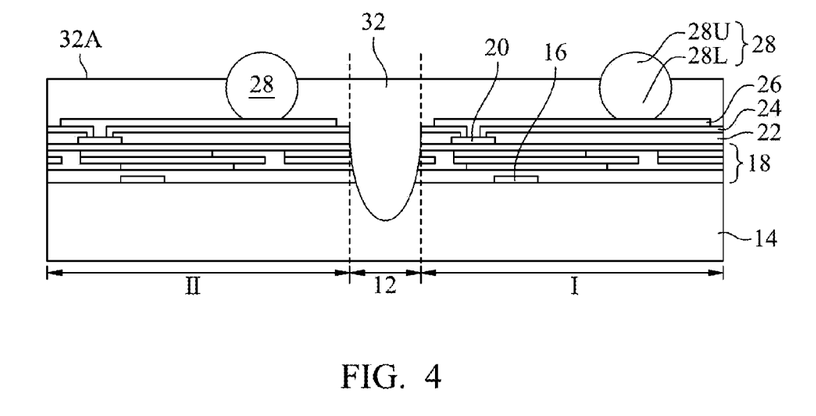

Next, as shown in FIG. 4, a molding compound layer 32 is applied on the resulted structure depicted in FIG. 3 to cover the PPI structures 26 and the protective layer 24 and fill the grooves 30, where each bump 28 is partially buried in the molding compound layer 32. In an embodiment, each bump 28 includes a lower portion 28L and an upper portion 28U, and the molding compound layer 32 is in physical contact with a lower portion 28L of the bump 28, while the upper portion 28U of the bump 28 is exposed and protrudes from a top surface 32A of the molding compound layer 32. In some embodiments, the thickness of the molding compound layer 32 is between about ¼ to ¾ of the height of the bump 28. In an embodiment, the molding compound layer 32 is formed by applying a liquid molding compound and performing a curing process to cure and solidify the liquid molding compound. In some embodiments, a release film or a soft material may be applied on the liquid molding compound. Pressure is applied on the release film on the liquid molding compound, so that portions of the bumps 28 are pressed into the release film. Furthermore, the pressure applied on the release film may push some of liquid molding compound downward. While the pressure is applied to the release film pushing against the bumps and the liquid molding compound, a curing may be performed to cure and solidify liquid molding compound. Thereafter, the release film is peeled off the molding compound layer 32. In some embodiments, a plasma cleaning process is performed after forming the molding compound layer 32. The plasma cleaning process is performed in order to ensure that the bumps 28 are clean and free of the molding compound material for a subsequent bonding process, for example. In some embodiments, the plasma cleaning process is not performed.

Figure 5:
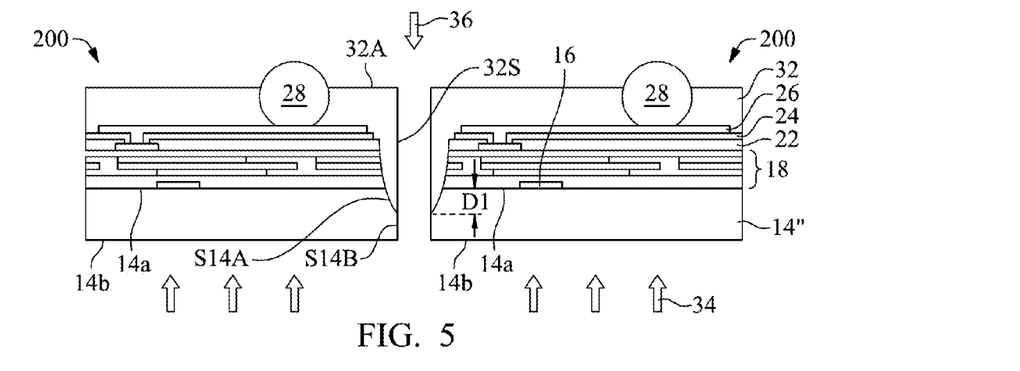

Next, a grinding process 34 is performed on the backside of the wafer 100 so as to thin down the thickness of the semiconductor substrate 14, and then a second cutting process 36 (also referred to as a die singulation process 36) is performed on the scribe line regions 12 to separate the individual packaged semiconductor devices 200 from the wafer 100 as depicted in FIG. 5. In an embodiment, the wafer 100 is positioned upside down and attached to a tape, followed by performing the grinding process 34 on the backside of the semiconductor substrate 14 to thin down the thickness of the semiconductor substrate 14. The grinding process 34 does not expose the bottom 30b of the groove 30, and therefore the thinned substrate 14" has a thickness greater than the depth D1 of the groove 30. The die singulation process 36 is then performed on the scribe line regions 12 to remove the molding compound layer 32 within the grooves 30 so as to form a sidewall 32S. The die singulation process 36 is also performed to remove the thinned substrate 14" underlying the grooves 30 so as to form a sidewall S14B adjacent to the backside 14b of the thinned substrate 14". In an embodiment, the sidewall S14B is substantially aligned with the sidewall 32S, and the sidewall S14B is physically connected to the sidewall S14A adjacent to the frontside 14a of the semiconductor substrate 14 formed by the pre-cutting process 29. An example individual package device 200 includes the molding compound layer 32 covering the lower portion 28L of the bump 28, the surfaces of the PPI structure 26 and the protection layer 24, and the sidewalls S24, S22, S18 and S14A, while the sidewall S14B is exposed. The singulation process 36 may use a mechanical sawing process, a laser cutting process, a laser micro-jet cutting process, or the like. In an embodiment, the wafer 100 and the molding compound layer 32 are fully diced using a mechanical sawing process, for example a blade sawing on the scribe line regions 12 of the wafer 100. The blade cuts in substantially the same location that the pre-cutting process 29 previously cut, in some embodiments.

Figure 6:
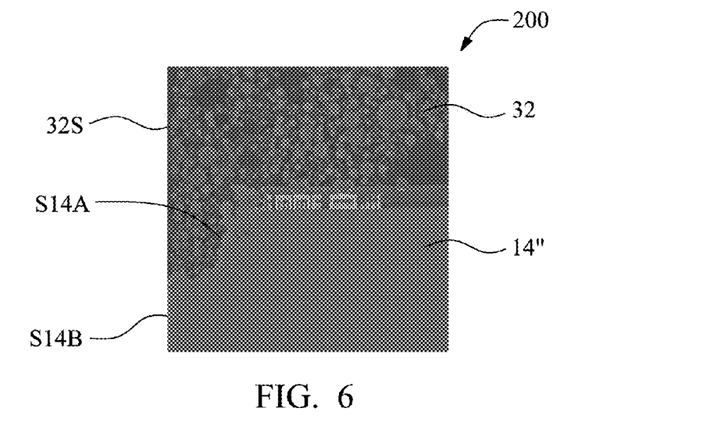
FIGS. 6 to 7 are optical micrograph images of a portion of a packaged semiconductor device in accordance with some embodiments.

FIG. 6 is an optical micrograph image of a portion of a packaged semiconductor device 200 in accordance with some embodiments. The semiconductor substrate 14 has the sidewall S14A formed by the pre-cutting process 29 and the sidewall S14B formed by the die singulation process 36. In an embodiment, when a laser cutting process is employed in the pre-cutting process 29, the sidewall S14A is formed of a curved sidewall with a rough surface, for example a zigzag macro-step surface. Similarly, the sidewalls S24, S22 and S18 are formed of curved sidewalls with rough surfaces when a laser cutting process is employed in the pre-cutting process 29. In some embodiments, when a mechanical sawing process is employed in the die singulation process 36, the sidewall S14B is formed of a substantially vertical sidewall with a flat surface.

Figure 7:
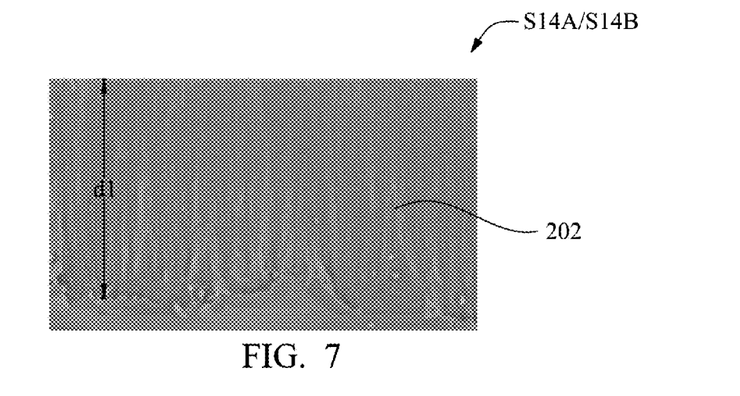

FIG. 7 is an optical micrograph image of a portion of a packaged semiconductor device 200 in accordance with some embodiments. In an embodiment of using a laser micro-jet cutting process in the pre-cutting process 29 and/or the die singulation process 36, the laser cutting with water jet is employed and a plurality of ripples 202 can be observed on the silicon surface of the sidewall S14B and/or S14A. The distribution of the ripples 202 is about 20% to about 95% of the silicon surface, and the ripples 202 can avoid stress concentration in some embodiments, for example. The plurality of ripples 202 has a length d1 that about 30 μm to about 230 μm in some embodiments. For example, d1 is about 150 μm.

Figure 8:
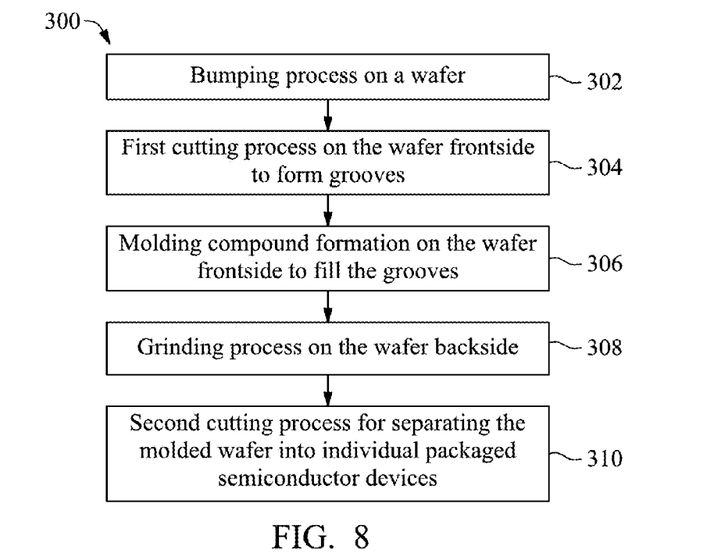
FIG. 8 is a flow chart of a method of packaging and dicing a semiconductor device in accordance with some embodiments.

FIG. 8 is a flow chart 300 of a method of packaging and dicing a semiconductor device in accordance with some embodiments. In step 302, a bumping process is performed on a received wafer (see also FIG. 1 and FIG. 2). In step 304, a first cutting process is performed on the wafer frontside to form grooves on the scribe line regions of the wafer (see also FIG. 3). The first cutting process is a precutting process which can use a laser cutting process, a laser micro-jet cutting process, a mechanical sawing process, a blade sawing process or the like. In step 306, a molding compound is formed on the wafer frontside to fill the grooves (see also FIG. 4). In step 308, a grinding process is performed on the wafer backside. In step 310, a second cutting process is performed to separate individual packaged semiconductor devices from the molded wafer (also see FIG. 5). The second cutting process is a die singulation process which can use a laser cutting process, a laser micro-jet cutting process, a mechanical sawing process, a blade sawing process or the like.

The packaging and dicing method employs the pre-cutting process with a grooving function, which can avoid microcracks and a potential risk of fracture, and prevent cracks and peeling between the die and the molding compound material. Die corner bump protection is strengthened, and micro-cracks at sidewalls are avoided, which can induce peeling below the die and die interface after temperature cycling. The packaging and dicing method can increase process windows and enhance reliability lifetime for WLC-SPs. A reduction in heat-affected zones is achieved, which results in a reduction in yield loss. In some embodiments, the die on the wafer include low dielectric constant materials that have a dielectric constant less than that of silicon dioxide, which may comprise relatively fragile or porous materials that are susceptible to damage and delamination. Advantageously, in embodiments of using the laser to perform the pre-cutting process, damages to the low dielectric constant materials during the singulation process can be prevented or reduced. The laser simultaneously removes the low dielectric constant materials of the die and decreases heat-affected zones and cracks from occurring. In some embodiments, the laser can be used as a grooving tool prior to a mechanical sawing procedure for WLCSPs. Grooving the die prior to depositing the molding compound material results in an improved process window for thermal cycle (TC) tests. For example, test results showed that TC test process windows were improved by about 50% in some embodiments.

Figure 9:
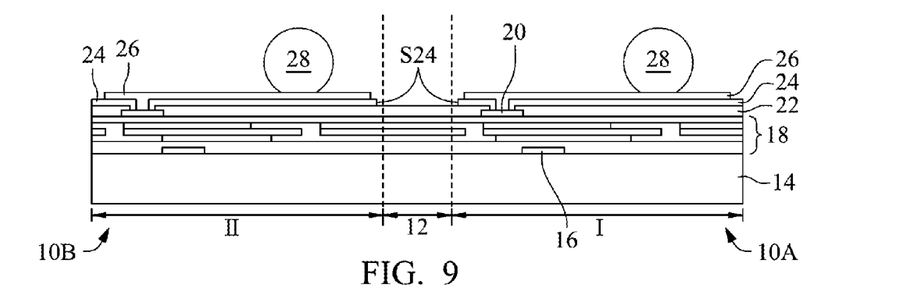
FIGS. 9 to 11 are cross-sectional views illustrating a method of packaging and dicing a semiconductor device at various stages in accordance with some embodiments.
Figure 10:
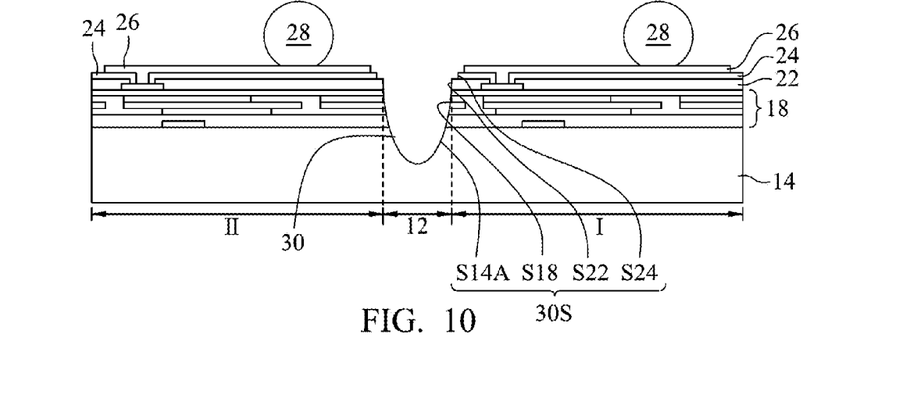
Figure 11:
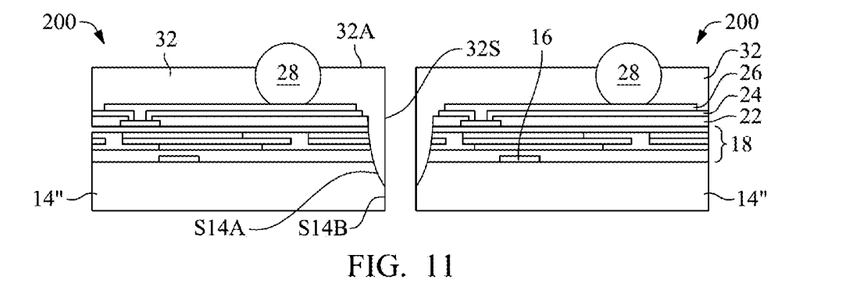

FIG. 9 through 11 are cross-sectional views illustrating a method of packaging and dicing a semiconductor device at various stages in accordance with some embodiments. Unless specified otherwise, the reference numerals in these embodiments represent like elements in the embodiments illustrated in FIGS. 1~5.

With reference to FIG. 9, in manufacturing each die 10A and 10B on the die regions I and II, the interconnect structure 18 and layers 22 are formed to extend to the scribe line regions 12, while the PPI structures 26 and the protection layer 24 are not formed on the scribe line regions 12. In the following pre-cutting process 29 as shown in FIG. 10, the removed materials within the scribe line regions 12 include portions of the passivation layer 22, the interconnect structure 18 and the semiconductor substrate 14 to form sidewalls S22, S18 and S14A in a continuous manner, resulting in the sidewall portion 30S of the groove 30. Therefore the sidewall S24 of the protection layer 24 is not aligned with the sidewall S22 of the passivation layer 22.

With reference to FIG. 11, after the formation of the molding compound layer 32 on the resulted structure shown in FIG. 10, the die singulation process 36 is performed on the scribe line regions 12 to separate the individual packaged semiconductor devices 200 from the wafer 100. A plasma clean process and a wafer backside grinding process can be performed before the die singulation process 36 in accordance with some embodiments. In the packaged semiconductor device 200, the molding compound layer 32 covers the PPI structure 26 and the protection layer 24, and also covers the sidewalls S24, S22, S18 and S14A, while the sidewall S14B is exposed.

Figure 12:
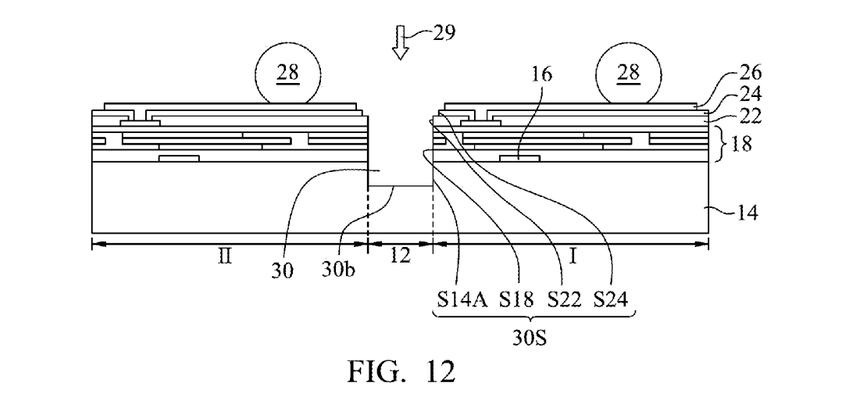
FIGS. 12 to 13 are cross-sectional views illustrating a method of packaging and dicing a semiconductor device at various stages in accordance with some embodiments.
Figure 13:
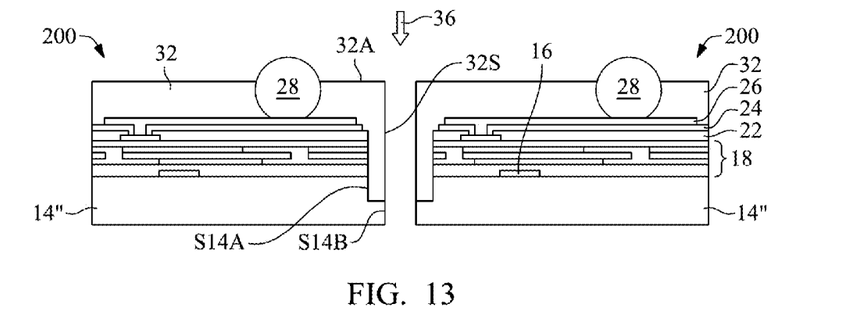

FIG. 12 through 13 are cross-sectional views illustrating a method of packaging and dicing a semiconductor device at various stages in accordance with some embodiments. Unless specified otherwise, the reference numerals in these embodiments represent like elements in the embodiments illustrated in FIGS. 1~5.

With reference to FIG. 12, the pre-cutting process 29 is performed on the semiconductor wafer 100 to form grooves 30 on the scribe line regions 12. In an embodiment, the pre-cutting process 29 is a mechanical sawing process that uses the blade to remove materials within the scribe line regions 12, including portions of the passivation layer 22, the interconnect structure 18 and the semiconductor substrate 14 to form sidewalls S22, S20, S18 and S14A in a continuous manner, resulting in the sidewall portion 30S of the groove 30. The bottom 30b of the groove 30 reaches a depth D1 of the semiconductor substrate 14 without penetrating the semiconductor substrate 14. In an embodiment, the sidewall portion 30S of the groove 30 is substantially vertical with smooth surfaces. In some embodiments, the bottom portion 30b of the groove 30 is substantially planar with a smooth surface.

With reference to FIG. 13, the molding compound layer 32 is applied on the structure depicted in FIG. 12 to cover the PPI structures 26 and the protective layer 24 and fill the grooves 30, where each bump 28 is partially buried in the molding compound layer 32. In some embodiments, a plasma cleaning process is performed after forming the molding compound layer 32. After performing a grinding process 34 is performed on the backside of the wafer 100, the die singulation process 36 is performed on the scribe line regions 12 to separate the individual packaged semiconductor devices 200 from the wafer 100. The die singulation process 36 removes the molding compound layer 32 within the grooves 30 so as to form a sidewall 32S of the molding compound layer 32. The die singulation process 36 also removes the thinned semiconductor substrate 14 underlying the grooves 30 so as to form a sidewall S14B of the thinned semiconductor substrate 14". In an embodiment, the singulation process 36 uses a mechanical sawing process on the scribe line regions 12 of the wafer 100, and therefore the sidewall surface 32S is substantially aligned with and physically connected to the sidewall S14B, and the sidewall S14B is formed of a substantially vertical sidewall with a flat surface.

Figure 14:
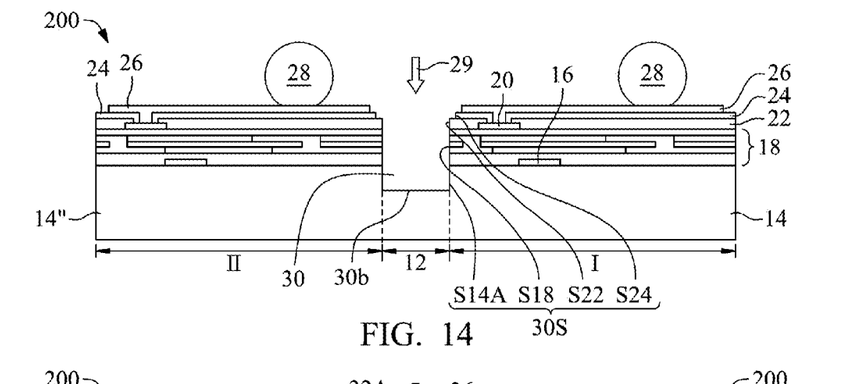
FIGS. 14 to 15 are cross-sectional views illustrating a method of packaging and dicing a semiconductor device at various stages in accordance with some embodiments.
Figures 15, 16:
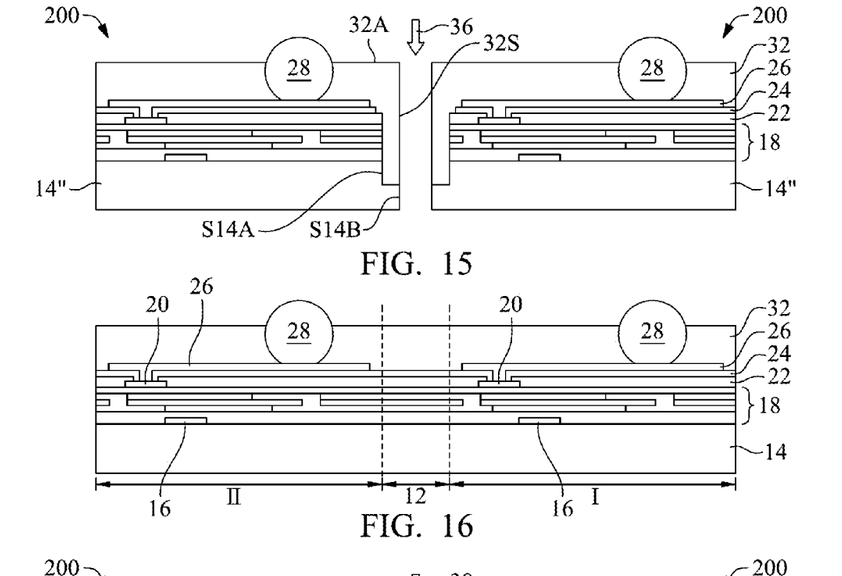
FIGS. 16 to 17 are cross-sectional views illustrating a method of packaging and dicing a semiconductor device at various stages in accordance with some embodiments.

FIG. 14 through 15 are cross-sectional views illustrating a method of packaging and dicing a semiconductor device at various stages in accordance with some embodiments. Unless specified otherwise, the reference numerals in these embodiments represent like elements in the embodiments illustrated in FIGS. 12~13. The method of packaging and dicing a semiconductor device is applied on a formed structure on which the PPI structures 26 and the protection layer 24 are not formed on the scribe line regions 12, and thus the sidewall S24 of the protection layer 24 is not aligned with the sidewall S22 of the passivation layer 22. In an embodiment of using the mechanical sawing process in the pre-cutting process 29 and the die singulation process 36, the sidewall portion 30S of the groove 30 is substantially vertical with a smooth surface and the sidewall S14B is substantially vertical with a flat surface. In the packaged semiconductor device 200, the molding compound layer 32 covers the PPI structure 26 and the protection layer 24, and also covers the sidewalls S24, S22, S18 and S14A, while the sidewall S14B is exposed.

Figure 17:
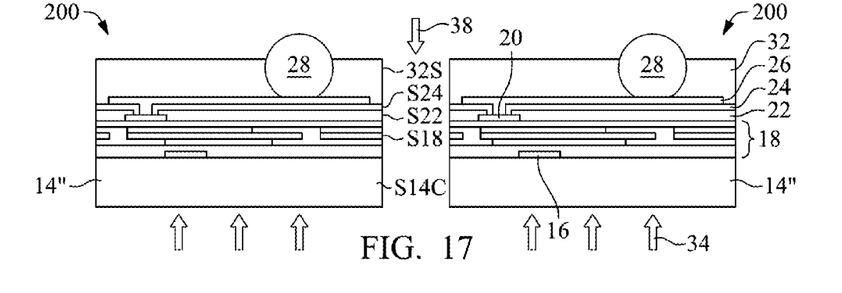

FIGS. 16~17 are cross-sectional views illustrating a method of packaging and dicing a semiconductor device at various stages in accordance with some embodiments. Unless specified otherwise, the reference numerals in these embodiments represent like elements in the embodiments illustrated in FIGS. 1~5.

With reference to FIG. 16, in manufacturing each die 10A and 10B on the die regions I and II, semiconductor processes are performed on the semiconductor substrate 14 to form the electrical circuitries 16, the interconnect structure 18, the contact pads 20, the passivation layer 22, the protection layer 24, the PPI structures 26 and the bumps 28. In an at least one embodiment, the interconnect structure 18 and layers 22 and 24 are formed to extend onto the scribe line regions 12, while the PPI structures 26 are not formed on the scribe line regions 12. The molding compound layer 32 is applied to cover the PPI structures 26, the protective layer 24 and the passivation layer 22, where each bump 28 is partially buried in the molding compound layer 32. In some embodiments, a plasma cleaning process is performed after forming the molding compound layer 32.

Next, as shown in FIG. 17, after performing a grinding process 34 on the backside of the wafer 100, a die singulation process 38 is performed on the scribe line regions 12 to separate the individual packaged semiconductor devices 200 from the wafer 100. The die singulation process 38 removes the molding compound layer 32 within the scribe line regions 12 so as to form a sidewall 32S of the molding compound layer 32. The die singulation process 38 also removes the layers 24, 22 and 18 in the scribe line regions 12 to form the sidewalls S24, S22 and S18. The die singulation process 38 also removes the semiconductor substrate 14 in the scribe line regions 12 to form a sidewall S14C. In the packaged semiconductor device 200, the sidewall 32S of the molding compound layer 32 is substantially aligned with the sidewalls S24, S22, S18, and S14C.

The die singulation process 38 may use a mechanical sawing process, a laser cutting process, a laser micro-jet cutting process, or the like. In an embodiment, the wafer 100 and the molding compound layer 32 are fully diced using a laser cutting process. The laser cutting process emits a laser beam to provide a full laser cut through the materials in the scribe regions 12. In some embodiments, the laser cutting process employs a laser micro-jet cutting method.

Figure 18:
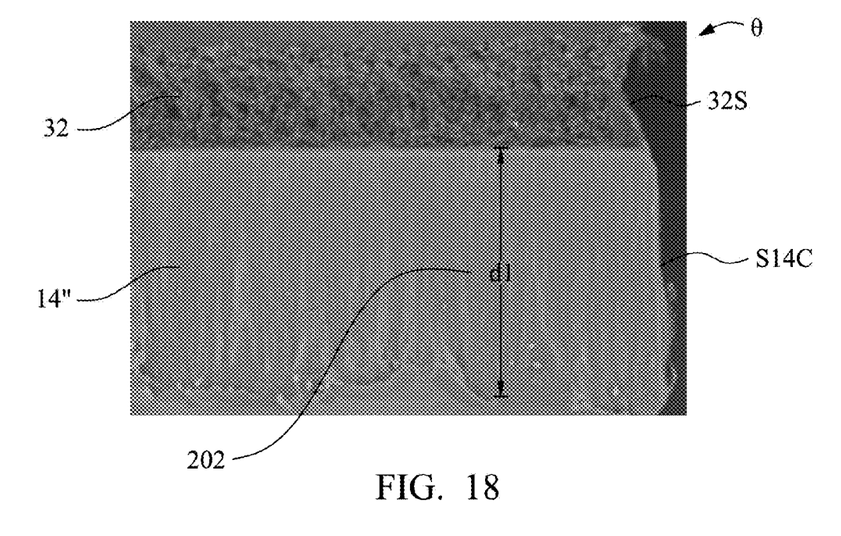
FIG. 18 shows images of sidewalls of a semiconductor device after the packaging and dicing process shown in FIG. 17 in accordance with some embodiments.

FIG. 18 shows images of sidewalls of the molding compound layer 32 and the silicon substrate 14 after the packaging and dicing process shown in FIG. 17 in accordance with some embodiments. In an embodiment of using the laser cutting process, the sidewalls 32S and S14C includes different shapes, resulting in a cliff structure which releases stress concentrations with negligible mechanical force. The sidewall 32S of the molding compound layer 32 includes an inward curve with respect to the sidewall 32S. An angle θ of the curve of the sidewall 32S is about 10 degrees to about 90 degrees, for example, which is advantageous in some embodiments by avoiding stress concentrations. In an embodiment of using the laser cutting process with water jetting, a plurality of ripples 202 is observed on the silicon surface of the sidewall S14C after the die singulation process 38. The distribution of the plurality of ripples 202 is about 20% to about 95% of the silicon surface in some embodiments, for example. The plurality of ripples 202 has a length d1, which is about 30 µm to about 230 µm in some embodiments. For example, d1 is about 150 µm.

Figure 19:
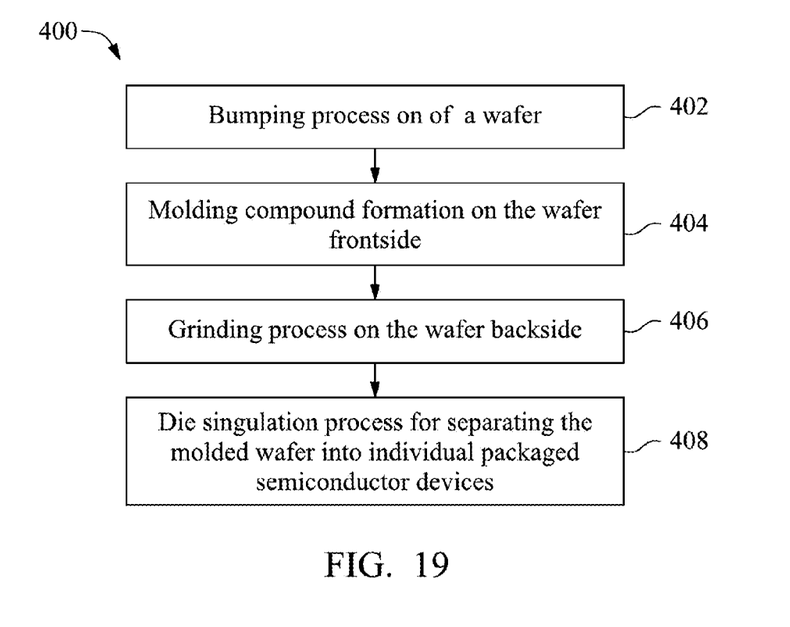
FIG. 19 is a flow chart of a method of packaging and dicing a semiconductor device in accordance with some embodiments.

FIG. 19 is a flow chart 400 of a method of packaging and dicing a semiconductor device in accordance with some embodiments. In step 402, a bumping process is performed on a received wafer (see also FIG. 16). In step 404, a molding compound is formed on the wafer frontside (see also FIG. 16). In step 406, a grinding process is performed on the wafer backside. In step 408, a die singulation process is performed to separate individual packaged semiconductor devices from the molded wafer (also see FIG. 17).

The packaging and dicing method employs the laser cutting process for a full cut in the dicing process to form a cliff structure in a cross-sectional view due to the different shape of removal of the molding compound layer 32 and the semiconductor substrate 14, which occurs because of differences in material properties. The cliff structure decreases die sidewall damage, which can occur from mechanical saw blades, and a step structure is not formed, which eliminates weak points in the sidewalls. The cliff structure also releases stress concentration, with negligible mechanical force. Experimental results showed that utilizing a laser for a full cut of WLCSPs resulted in no debris and no cracks formed at the interface of the die and the molding compound layer. Embodiments of the present disclosure result in decreased or eliminated debris and cracks from the dicing process. Using the laser for a full dicing of the WLCSPs reduces or prevents the molding compound layer from peeling away from the die during thermal cycling, because less stress is introduced during the dicing process. The methods and structures do not require preventative or protection layers for laser grooving, resulting in a cost savings. Higher output and improved dicing quality are achieved. Furthermore, the novel packaging and dicing methods and structures described herein are easily implementable in manufacturing and packaging process flows.

In some embodiments, a method of forming a packaged semiconductor device includes the following steps. First, a wafer is received with a first die region, a second die region and a scribe line region between the first die region and the second die region. In an embodiment, the wafer includes a interconnect structure on a semiconductor substrate, a plurality of contact pads on the interconnect structure, a passivation layer on the semiconductor substrate and overlying the plurality of contact pads, a protection layer on the passivation layer, a plurality of post-passivation interconnect (PPI) structures on the protection layer and electrically connected to the plurality of contact pads, and at least one bump physically contacting at least one of the plurality of PPI structures. Then a first cutting process is performed on the wafer to form a groove passing through the passivation layer and the interconnect structure on the scribe line region and a portion of the semiconductor substrate on the scribe line region. Next, a molding compound layer is formed on a frontside of the wafer to cover the protection layer and the PPI structures and fill the groove and surround the bumps. After performing a grinding process on a backside of the wafer to thin down the semiconductor substrate, a second cutting process is performed on the wafer to separate the first die region from the second die region. The second cutting process cuts through the molding compound layer in the groove and the semiconductor substrate underlying the groove.

In some embodiments, a method of forming a packaged semiconductor device including the following steps on a received wafer. In an embodiment, the wafer includes a first die region, a second die region and a scribe line region between the first die region and the second die region. The wafer includes an interconnect structure on a semiconductor substrate, a plurality of contact pads on the interconnect structure, a passivation layer on the semiconductor substrate and overlying the plurality of contact pads, a protection layer on the passivation layer, a plurality of post-passivation interconnect (PPI) structures on the protection layer and electrically connected to the plurality of contact pads, and at least one bump physically contacting at least one of the plurality of PPI structures. First, a molding compound layer is formed on a frontside of the wafer to cover the protection layer and the PPI structures and surround the bumps. Then a grinding process is performed on a backside of the wafer to thin down the semiconductor substrate. Next, a die singulation process is performed on the wafer to separate the first die region from the second die region. The die singulation process cuts through the molding compound layer, the passivation layer, the interconnect structure and the semiconductor substrate on the scribe line region.

In other embodiments, a packaged semiconductor device includes a semiconductor substrate having a first sidewall adjacent to a frontside of the semiconductor substrate and a second sidewall adjacent to a backside of the semiconductor substrate; an interconnect structure on the semiconductor substrate and including a sidewall adjacent to the first sidewall of the semiconductor substrate; a contact pad on the interconnect structure; a passivation layer on the interconnect structure covering a portion of the contact pad and including a sidewall adjacent to the sidewall of the interconnect structure; a polymer layer on the passivation layer having an opening exposing the contact pad; a post-passivation interconnect (PPI) structure on the polymer layer and electrically connected to the contact pad through the opening of the polymer layer; a bump physically contacting the PPI structure; and a molding compound layer on the PPI structure and surrounding a lower portion of the bump. The molding compound layer covers the first sidewall of the semiconductor substrate, the sidewall of the interconnect structure and the sidewall of the passivation layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a packaged semiconductor device, comprising:
  receiving a wafer comprising a first die region, a second die region and a scribe line region between the first die region and the second die region, wherein the wafer comprises an interconnect structure on a semiconductor substrate, a plurality of contact pads on the interconnect structure, a passivation layer on the interconnect structure and overlying the plurality of contact pads, a protection layer on the passivation layer, the protection layer having an opening in the scribe line region exposing a top surface of the passivation layer, a plurality of post-passivation interconnect (PPI) structures on the protection layer and electrically connected to the plurality of contact pads, and at least one bump physically contacting at least one of the plurality of PPI structures;
  performing a first cutting process on the wafer to form a groove passing through the passivation layer, the interconnect structure and a portion of the semiconductor substrate on the scribe line region, wherein a portion of the top surface of the passivation layer remains exposed after the first cutting process;
  after performing the first cutting process, forming a molding compound layer on a frontside of the wafer to cover the protection layer and the PPI structures and fill the groove and surround the at least one bump, the at least one bump being present prior to forming the molding compound, the at least one bump protruding from the molding compound layer after forming the molding compound layer;
  performing a grinding process on a backside of the wafer to thin down the semiconductor substrate; and
  performing a second cutting process on the wafer to separate the first die region from the second die region, wherein the second cutting process cuts through the molding compound layer in the groove and the semiconductor substrate underlying the groove.

2. The method according to claim 1, wherein the first cutting process comprises a laser cutting process, and the second cutting process comprises a mechanical sawing process.

3. The method according to claim 2, wherein the first cutting process forms the groove with a curved sidewall portion.

4. The method according to claim 3, wherein the curved sidewall portion comprises a rough surface.

5. The method according to claim 2, wherein the second cutting process cuts through the semiconductor substrate underlying the groove to form a substantially vertical sidewall.

6. The method according to claim 1, wherein the first cutting process comprises a blade sawing process, and the second cutting process comprises a blade sawing process.

7. The method according to claim 6, wherein the first cutting process forms the groove with a substantially vertical sidewall portion.

8. The method according to claim 6, wherein the second cutting process cuts through the semiconductor substrate underlying the groove to form a substantially vertical sidewall.

9. The method according to claim 1, wherein the first cutting process cuts through the protection layer formed on the scribe line region.

10. The method according to claim 1, wherein the interconnect structure comprises a low-k dielectric layer and a metal line, and the first cutting process cuts through the low-k dielectric layer and the metal line on the scribe line region.

11. A method of forming a packaged semiconductor device, comprising:
  receiving a wafer comprising a first die region, a second die region and a scribe line region between the first die region and the second die region, wherein the wafer comprises an interconnect structure on a semiconductor substrate, a plurality of contact pads on the interconnect structure, a passivation layer on the interconnect structure and overlying the plurality of contact pads, a protection layer on the passivation layer, wherein the scribe line region is free of the protection layer, a plurality of post-passivation interconnect (PPI) structures on the protection layer and electrically connected to the plurality of contact pads, and at least one bump physically contacting at least one of the plurality of PPI structures;

forming a molding compound layer on a frontside of the wafer to cover the protection layer and the PPI structures and surround the at least one bump, wherein the at least one bump has been formed prior to forming the molding compound layer, wherein the molding compound physically contacts a top surface of the passivation layer;

after forming the molding compound layer, performing a grinding process on a backside of the wafer to thin down the semiconductor substrate; and after performing the grinding process, performing a die singulation process on the wafer to separate the first die region from the second die region, wherein the die singulation process cuts through the molding compound layer, the passivation layer, the interconnect structure and the semiconductor substrate on the scribe line region.

12. The method according to claim 11, wherein the die singulation process comprises a laser cutting process.

13. The method according to claim 12, wherein the die singulation process cuts through the molding compound layer to form a sidewall with an inward curve.

14. The method according to claim 11, wherein the die singulation process comprises a laser micro jet cutting process.

15. The method according to claim 14, wherein the die singulation process cuts through the semiconductor substrate to form a sidewall and a plurality of ripples on the sidewall.

16. A method of forming a packaged semiconductor device, comprising:

receiving a wafer, the wafer comprising a first die region, a second die region, and a scribe line region between the first die region and the second die region, wherein a protection layer and one or more post-passivation interconnect (PPI) structures are formed on the first die region and the second die region and not formed on the scribe line region, wherein the wafer further comprises an interconnect structure on a semiconductor substrate and at least one bump physically contacting at least one of the one or more of PPI structures;

performing a first cutting process on a frontside of the wafer to form a groove passing through a portion of the semiconductor substrate on the scribe line region, wherein sidewalls of the groove are laterally separated from sidewalls of the protection layer adjacent the groove;

after performing the first cutting process, forming a molding compound layer on the frontside of the wafer, wherein the molding compound layer fills the groove and surrounds at least one bump, a top surface of the at least one bump extending farther from the wafer than a top surface of the molding compound layer, the at least one bump being present prior to forming the molding compound; and performing a second cutting process on the wafer to separate the first die region from the second die region, wherein the second cutting process cuts through the molding compound layer in the groove and the semiconductor substrate underlying the groove.

17. The method according to claim 16, wherein the wafer further comprises a plurality of contact pads on the interconnect structure, a passivation layer on the interconnect structure and overlying the plurality of contact pads, wherein the protection layer is formed on the passivation layer, the one or more PPI structures are formed on the protection layer and electrically connected to the plurality of contact pads, and at least one bump physically contacting at least one of the plurality of PPI structures.

18. The method according to claim 16, wherein the first cutting process comprises a laser cutting process, and the second cutting process comprises a mechanical sawing process.

19. The method according to claim 16, wherein the first cutting process forms the groove with a curved sidewall portion.

20. The method according to claim 16, wherein the second cutting process forms a sidewall with a rippled surface.

* * * * *